United States Patent [19]

Harless

[11] 4,119,814
[45] Oct. 10, 1978

[54] HEARING AID WITH ADJUSTABLE FREQUENCY RESPONSE

[75] Inventor: Friedrich Harless, Nuremberg, Fed. Rep. of Germany

[73] Assignee: Siemens Aktiengesellschaft, Berlin & Munich, Fed. Rep. of Germany

[21] Appl. No.: 856,971

[22] Filed: Dec. 2, 1977

[30] Foreign Application Priority Data

Dec. 22, 1976 [DE] Fed. Rep. of Germany ...... 2658301

[51] Int. Cl.$^2$ ............................................. H04R 25/00
[52] U.S. Cl. ............................................. 179/107 FD
[58] Field of Search ................ 179/1 D, 1 F, 107 R, 179/107 FD; 333/28 T

[56] References Cited

U.S. PATENT DOCUMENTS 3,015,704  1/1962  Behymer .......................... 179/107 R Primary Examiner—George G. Stellar
Attorney, Agent, or Firm—Hill, Gross, Simpson, Van Santen, Steadman, Chiara & Simpson

[57] ABSTRACT

In the illustrated embodiments, a transistor amplifier stage has filter components in its input circuit providing a 12 dB/octave rise in response above a selected frequency. A bridging circuit of variable resistance may be provided for introducing a desired degree of low frequency response. A continuously controlled or switched transistor circuit may modify the resistance values in a base-emitter circuit and in a base-collector circuit of the filter network simultaneously to increase the cut-off frequency while retaining the 12 dB/octave rate of rise in response. Both the low frequency response in the attenuation range and the cut-off for the high frequency response range may be adjustable in the same amplifier stage, or a quantized selection of successive cut-off frequencies is feasible using e.g. a plurality of amplifier stages in cascade.

8 Claims, 6 Drawing Figures

HEARING AID WITH ADJUSTABLE FREQUENCY RESPONSE

BACKGROUND OF THE INVENTION

The invention relates to hearing aids wherein a transistor amplifier is disposed between the microphone and the earphone or other output transducer, and comprises a stage containing a frequency-determining network. Circuits of this type are used for the purpose of being able to adapt the effectiveness of hearing aids to the nature of the hearing difficulty (compare e.g., Jour. Acous. Soc. Am., Vol. 11, (1940) pp. 406 through 419).

Accordingly, a great many attempts have already been made to adapt to the frequency response which, in the case of a hearing-impaired individual, is detected as residual sensitivity. To this end, microphones have been employed in the hearing aid which have a rising frequency response, and, in addition, the coupling capacitors between the individual stages have been reduced to such an extent that a treble boost characteristic results. Moreover, sound frequency filters have been additionally used in which the input resistance of an amplifier stage in the hearing aid is reduced in combined action with the aforementioned coupling capacitor. However, these measures left much to be desired, because the effectiveness of sound filters of this type did not permit an optimum compensation of a majority of the treble losses. The sound filter should be effective in a single stage with a 12 dB per octave rising response.

From the German offengungsschift No. 2316939 e.g., an electric hearing aid circuit is known wherein the transmitted frequency range is divided into separate regulatable component regions. An improved adaptation to the frequency-dependency of reduced hearing ability is to be achieved thereby. However, for arrangements of this type, it is necessary to be able to vary the region of rising response (rising flank) of the filter frequency response characteristic within wider boundaries than hitherto. Doubtlessly, this necessitates a great outlay which is of particular disadvantage if it is desirable to construct small hearing aids to be worn on the head wherein only a small amount of installation space is available. In addition, a further disadvantage is that, due to fluctuations in the battery voltage, stabilization measures requiring great outlay become necessary for the continuous variability of the rising flank of the filter frequency response.

SUMMARY OF THE INVENTION

In the case of a hearing aid, the object underlying the invention consists in disclosing a frequency-determining network which represents a more effective sound filter with regard to an optimum adaptation. The effective sound filter is obtained through the utilization of a network which is connected to the input of an amplifier stage of the hearing aid amplifier as will be explained in a summary discussion which for purposes of clarity follows the detailed description of the illustrative embodiments.

The general details and advantages of the invention are specifically explained in the summary discussion at the conclusion of the specification. Still further objects, features and advantages of the invention will be apparent from the specific disclosure of the sample embodiments illustrated in the accompanying sheet of drawings.

DETAILED DESCRIPTION

Figure 1:
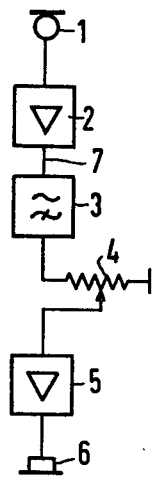
FIG. 1 illustrates a block circuit diagram of a hearing aid equipped with the inventive sound filter.

Description of FIG. 1

In FIG. 1, 1 designates a microphone which represents the sound input of a hearing aid and which delivers its signals to a preamplifier 2, which is followed by a sound filter 3, behind which is arranged a volume regulating element 4, to which is connected an output amplifier 5 at the outlet side from which the signals reach an earphone or other output transducer 6. In a known application of a hearing aid constructed in this manner, the sound occurrences arriving at microphone 1 are converted into electric signals which are then varied in amplifier arrangement 2-5 in a manner suitable for the hearing-impaired individual and then conveyed via the transducer 6 to the ear of the hearing-impaired individual in order to make it possible for said individual to hear, or to improve his hearing.

Figure 2:
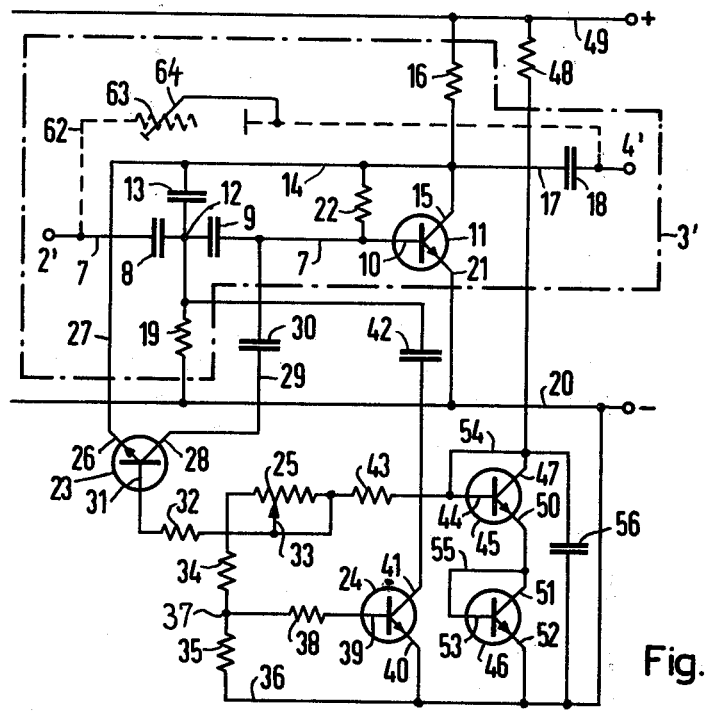
FIG. 2 illustrates the sound filter employed in FIG. 1 in greater detail and also illustrates elaborations to the basic circuit.

Description of FIG. 2

A sound filter 3 constructed in accordance with the invention is illustrated in FIG. 2, the basic components being enclosed in the area indicated by dot dash line 3'. Two capacitors 8 and 9 are disposed in a line 7 arriving from preamplifier 2 through a connection point 2'. Line 7 then leads further to the base 10 of the transistor 11. At the connection point 12 between two capacitors 8 and 9 there is connected an additional capacitor 13 which, via an additional line 14, is connected to the collector 15 of transistor 11. In addition, there are connected to the collector a resistance 16 in the line leading to the positive pole of the battery as well as a line 17 leading to a connection point 4' which leads to the volume control element 4 (FIG. 1). In addition, this line 17 contains a capacitor 18 in order that a DC-voltage-decoupling to the volume control 4 takes place, and, simultaneously in joint action with potentiometer 63, a correct phase relation results between the input signal at 2' and the output signal at 4'.

Point 12 is connected via a resistance 19 to a line 20 coming from the negative pole of the battery. Connected to this line 20 there is also the emitter 21 of transistor 11. The circuit, moreover, contains a resistance 22 between lines 7 and 14.

Regarding the mode of operation of the circuit, it must be noted that the sound filter basically consists of an amplifier stage comprising transistor 11 and resistances 16 and 22. Through capacitor 13 there results a multiple negative (or inverse) feedback which, in combined action with the remaining capacitors 8 and 9 as well as resistance 19, produces an active filter of the second degree. Resistance 22 is dimensioned such that, in combined action with resistance 16, an optimum control of the stage is achieved. The capacitances of capacitors 8, 9, and 13, as well as the value of resistance 19, are selected for a limit (or cut-off) frequency of 1000 Hz, whereby the mathematical relationships given in the following summary discussion are taken into consideration. The capacitances of the capacitors 8, 9, and 13, are equal here; namely, in order to obtain simple dimensioning specifications as in the following summary discussion. The actual mode of operation of sound filter of FIG. 2 thus results in such a manner that, upon arrival of sound at microphone 1, FIG. 1, an electrical signal results which is composed of a frequency spectrum of speech or other audible signals. This is then electrically amplified in preamplifier 2 and conveyed via line 7 to input 2' of the sound filter of FIG. 2. Capacitor 18 is already included in the transfer function of the filter and simultaneously serves the purpose of DC-voltage-decoupling relative to preamplifier 2. At the output point 4' of the filter, a signal then appears which, depending upon the adjustment of potentiometer 63, suppresses the frequencies from the speech frequency mixture which are below the limit (or cut-off) frequency of the filter. By means of the volume control; i.e., a variable resistance 4, FIG. 1, the latter signal can then be brought to a level which, upon passing through output amplifier 5, provides the volume desired by the hearing-impaired individual in transducer 6.

By supplementing the sound filter circuit contained in area 3' by transistors 23 and 24, the effectiveness of the sound filter contained in 3' is variable by means of a variable resistance 25. Emitter 26 of transistor 23 is here connected via a line 27 to line 14, and collector 28 is connected to line 7 via a line 29 which contains a capacitor 30. The base 31 of transistor 23 is connected via resistance 32 to the tap 33 of variable resistance 25, the one end of which is connected to a resistance 34 which is connected via a resistance 35 to a line 36 which leads to the negative pole of the battery. Tap 33 is directly connected to the other end of 32. The connection point 37 of resistances 34 and 35 is connected via a resistance 38 to the base 39 of transistor 24, whose emitter 40 is connected to line 36; i.e., to the negative pole of the battery, and whose collector 41 is connected via capacitor 42 to the connection of the resistance 19 with point 12. The second end and the tap of the variable resistance 25 are connected via a resistance 43 to the base 44 of the transistor 45 which, together with an additional transistor 46, effects the stabilization of the operating voltage. To this end, the collector 47 of transistor 45 is connected via a resistance 48 with a line 49 which is connected to the positive pole of a battery, and emitter 50 of transistor 45 is connected with the collector 51 of transistor 46, and emitter 52 of this transistor is also connected with the line 36 leading to the negative pole of the battery. Collector 47 and base 44, as well as collector 51 and base 53, respectively, are short-circuited via line 54 and via line 55. Moreover, via a capacitor 56, collector 47 is in connection with line 36, and thus, in connection with the negative pole of the battery.

With reference to the above-described method of operation of the basic circuit contained in 3', there results a shift (or displacement) of the frequency-determining resistances 19 and 22 by means of transistors 23 and 24 by a filtering-out of more or less low frequencies from the signal arriving at 2'. The limit (or cut-off) frequency is variable with variable resistance 25, because a voltage stabilized by transistors 45 and 46 varies the internal resistances of transistors 23 and 24 via the change in the operating point of transistors 23 and 24.

Figure 3:
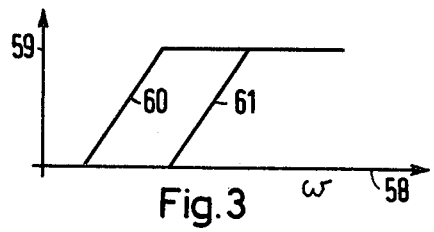
FIGS. 3 through 5 illustrate by means of frequency response diagrams the effect of the adjustable elements shown in FIG. 2.
Figure 4:
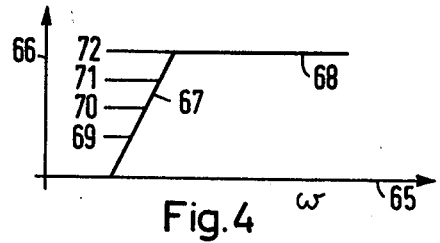
Figure 5:
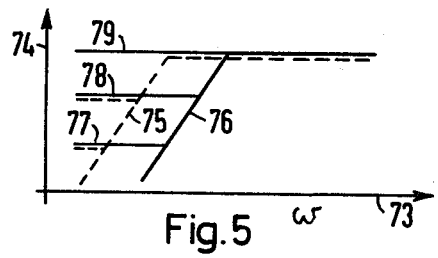

Description of FIGS. 3-5

FIG. 3 illustrates a diagram wherein there is represented on the ordinate axis 59 the amplitude of the output voltage, while on the abscissa axis 58, the frequency is the variable. Both axes 58 and 59 have logarithmic scales. The input voltage is amplitude-constant. By shifting the tap 33, a displacement of the amplification rise characteristic from line 60 to line 61 can take place; i.e., the amplification increase as a function of frequency is shifted to higher frequencies. Since a continuous shift of tap 33 is possible, a continuous shift of the amplification rise; for example, from 60 to 61, is also possible.

Whereas an influencing of the limit (or cut-off) frequency is possible through the components lying within area 3' in FIG. 2, it is possible for a change in the attenuation in the stop band of the filter to take place; i.e., an adjustment of the amplification in the stop band, by means of a bridging 62 of the input point 2' with the output point 4' via a potentiometer 63. To this end, the adjustable resistance element 63 is adjusted such that the resistance value of the element 63 is enlarged for an increase in the attenuation, and the resistance value is reduced for a decrease in the attenuation. The adjustable resistance element 63 is intended to interrupt at the highly ohmic (or maximum resistance) end of its adjustment range; i.e., it should be possible to make the bridging at 62 between points 2' and 4' ineffective in order to also be able to entirely eliminate the third pole.

The method of operation of potentiometer 63 is apparent from the curve representation in FIG. 4. As in FIG. 3, the frequency is indicated along the abscissa 65, and the amplitude of the output voltage is indicated along the ordinate axis 66. Given a position of tap 64 at which virtually no passage remains open through bridging 62, the amplification rise 67 extends from the abscissa 65 to the maximum value indicated by line 68. However, if, by reducing the resistance of potentiometer 63, a passage is produced through bridging or bypass line 62, the rise (filter flank) 67 is shortened corresponding to the output voltages as a function of frequency indicated by the respective lines 69 through 72; i.e., the amplification rise 67 is reduced through expansion of the pass-band through bridging line 62. At the short-circuit condition; i.e., at a resistance of zero presented by potentiometer 63, the low frequency response reaches the amplification of the pass-band region which is indicated by the same position of line 72 and the uppermost amplification possibility 68. There is then no further amplification rise 67 between the latter.

With the combined action of the influencing of the limit (or cut-off) frequency, indicated in FIG. 3, and the change in the attenuation of the stop-band of the filter, explained in FIG. 4, the variability of the method of operation of the sound filter illustrated in FIG. 5 is achieved. Here, also, the frequency is plotted along the abscissa 73, and the output voltage at point 4' is plotted in the direction of the ordinate 74. By effecting a change at variable resistance 25, a shift of the amplification rise 75 (illustrated in a broken line) relative to the rise 76 (indicated in a solid line) is possible, or conversely. On the other hand, a change in the commencement of amplification as a function of frequency corresponding to lines 77 through 79 is possible through an adjustment of potentiometer 63 corresponding to the indicated lines 77 through 79. In this fashion, a wide variation of adjustment possibilities is obtained, so that, depending upon the position of the potentiometers 25 and 63 between an extreme wide-band characteristic and a narrow-band treble characteristic, all variants of the frequency response can be selected.

Figure 6:
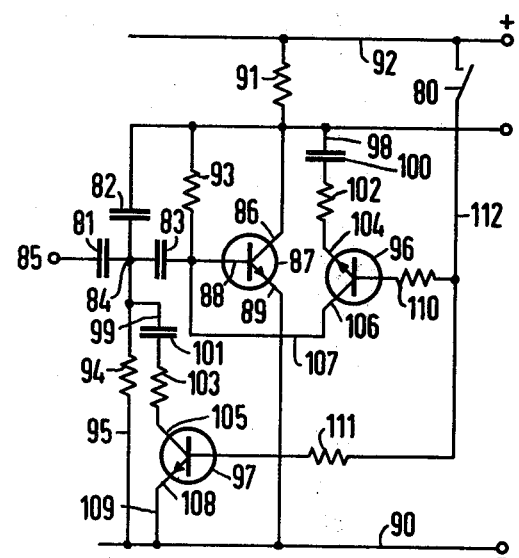
FIG. 6 illustrates a variant of the embodiment of FIG. 2 constructed with regard to a switchable adjustability.

Description of FIG. 6

In FIG. 6 a variation is illustrated in which two fixedly adjusted limit (or cut-off) frequencies are provided either of which can be selected by means of switch 80. The actual basic circuit corresponds to that which is contained in area 3' in FIG. 2, and consists of three capacitors 81 through 83 which are interconnected at point 84. From the exterior, capacitor 81 is connected to the input point 85 of the sound filter, capacitor 82 is connected to collector 86 of transistor 87, and capacitor 83 is connected to base 88 of transistor 87. The respective emitter 89 is connected with line 90 and the negative pole of a battery, whereas collector 86 is connected via a resistance 91 with a conductor 92 and the positive pole of the battery. Moreover, collector 86 is connected to the base via a resistance 93. In addition, a line 95 leads from point 84 via a resistance 94 to line 90 which is connected to the negative pole of the battery. Corresponding to the parts contained outside of the area 3' in FIG. 2, i.e., transistors 23 and 24, in accordance with the present circuit transistors 96 and 97 are provided which bridge resistance 93 and resistance 94, respectively. To this end, they manifest, in a line 98 and 99, respectively, a capacitor 100 and 101 and a resistance 102 and 103, in respective succession, which lead to the emitter 104 and the collector 105, respectively. A direct connection 107 is then present leading from collector 106 of transistor 96 to base 88 of transistor 87, whereas emitter 108 is connected via a line 109 with line 90 leading to the negative pole of the battery. Both transistors 96 and 97 are then respectively connected, via a resistance 110 or 111, to switch 80 which lies in line 112 leading via line 92 to the positive pole of the battery.

In contrast with the arrangement of FIG. 2, transistors 96 and 97 are here employed as switches which connect resistance 103 in parallel with resistance 94 and resistance 102 in parallel with resistance 93. Capacitors 100 and 101 serve the purpose of voltage decoupling. When switch 80 is closed, a current flow is achieved into the base of transistors 96 and 97 through resistances 110 and 111. Through the selection of the dimensioning of resistances 102 and 103, the second edge frequency; i.e., the location of line (or filter flank) 61 in FIG. 3, is determined. For the diagram in FIG. 3, for example, it is possible to set the limit (or cut-off) (or edge) frequency of line 60 at 1000 Hz and that of line 61 at 2000 Hz because a particularly marked clustering results in this range during evaluation of statistics regarding audiograms.

Summary Discussion of the Invention

In the following general discussion of the inventive features and advantages, reference characters are used to refer generically to the analogous components in the illustrative embodiments of FIGS. 2 and 6. The following table shows the corresponding components.

| Generic Designation | Reference Numeral of Corresponding Component | |
|---|---|---|
| | FIG. 2 | FIG. 6 |
| Transistor $T_1$ | 11 | 87 |
| Capacitor $C_1$ | 8 | 81 |
| Capacitor $C_2$ | 9 | 83 |

| Generic Designation | Reference Numeral of Corresponding Component | |
|---|---|---|
| | FIG. 2 | FIG. 6 |
| Capacitor $C_3$ | 13 | 82 |
| Resistance $R_1$ | 19 | 94 |
| Resistance $R_2$ | 22 | 93 |
| Resistance $R_3$ | 16 | 91 |

In the signal input line to the base of transistor $T_1$ of the filter stage, there are disposed a first capacitor $C_1$ and a second capacitor $C_2$. Between $C_1$ and $C_2$, a connection branches off via a third capacitor $C_3$ to the collector electrode of transistor $T_1$ of this stage, to which the output and a connection to one pole of the current source are also connected. In addition, the collector of transistor $T_1$ is connected via a resistance $R_2$ to the base electrode of $T_1$, and the connection point between the first and second capacitor is connected to the resistance $R_1$, and the emitter electrode is likewise connected to the second pole of the current source. Additional variants which shall be described further below provide hearing aids with a two-and multi-channel characteristic in which the frequency, by means of which the channels are separated, can be shifted one octave. This may take place through a simultaneous change in the resistances $R_1$ and $R_2$; e.g., through an additional variable resistance 25 in FIG. 2. In addition, the amplification in the stop band of the filter, i.e., in the case of frequencies which are smaller than the cut-off frequency of the filter, can be regulated via an additional regulating unit such that it is possible to simultaneously jointly compensate a slight low frequency loss on the part of the patient (as in FIGS. 4 and 5).

The transistor amplifier required for the construction of the active filter may also be modified, e.g. by the insertion of an emitter resistance, or by designing the amplifier in a multi-stage construction and newly adjusting the operating point through a modification of $R_2$, the consequence of which is then also a redimensioning of $C_1$, $C_2$, $C_3$, and $R_1$.

In the case of the amplifier stage formed from transistor $T_1$ and resistances $R_1$ and $R_2$, a multiple coupling is achieved through capacitor $C_3$. This multiple coupling, in combined action with the first two capacitors $C_1$ and $C_2$, and with resistance $R_1$, yields an active filter of the second degree. As is known, such a filter is designated as being of second degree which, in contrast with the filter of the first degree, has a slope steepness of 12 dB/Octave instead of 6 dB/Octave. The resistance $R_2$ disposed between the collector and the base of transistor $T_1$ is to be expediently dimensioned such that an operating point is set in combined action with the resistance $R_3$ disposed in the connection of the collector with the battery, on the one hand, the stage being optimally controllable with said operating point such that limitation ensues symmetrically. A different type of layout is, as a rule, certainly always undesirable, because, on account of non-symmetrical limitation, the intelligibility of the hearing aid is more strongly reduced than in the case of symmetrical limitation. On the other hand, the desired limiting (or cut-off) frequency is to be adjusted together with capacitors $C_1$, $C_2$, and $C_3$, and the resistance $R_1$ connecting their linkage point to ground. This results from the general transfer function of the filter. Accordingly, an increase by means of simultaneous reduction of $R_1$ and $R_2$ can be achieved, and a reduction can be achieved by means of simultaneous enlargement of $R_1$ and $R_2$. The circuit is to be expediently dimensioned such that all capacitors have equal capacitance because the dimensioning specifications then become particularly simple, as is apparent from the following calculations.

The mode of operation of the inventive circuit comprising a circuit constructed of capacitors of equal capacitance: $C_1 = C_2 = C_3 = C$, has a transfer function H (S); i.e., a function which describes the Laplace-transform of the output signal $U_a(s)$ as a function of the Laplace-transform of the input signal $U_e(s)$. If one then postulates the quality $s = j\omega$, $H(j\omega)$ then provides information regarding the transfer properties of the circuit in the frequency range. The transfer function of the circuit described herein is reproduced here in an approximated fashion through the following equation:

$$H(s) = \frac{U_a(s)}{U_e(s)} = \frac{s^2 R_1 R_2 C^2}{s^2 R_1 R_2 C^2 + 3s R_1 C + 1}$$

$s = j\omega$; $j = \sqrt{-1}$; $\omega =$ angular frequency;
$C =$ capacitance of the capacitors employed.

From this relation, the dimensioning specifications result:

$$R_1 = \frac{a_1}{3\omega_g C a_2}; R_2 = \frac{3}{\omega_g C a_2}$$

$a_1$ and $a_2$ are here the characteristic filter coefficients; $\omega_g$ is the 3 dB-limit (or cut-off) frequency; i.e., the frequency at which the frequency characteristic lies 3 dB below the amplification value in the pass band.

$R_1$ and $R_2$ are to be regarded in the same manner as those resistances cited above.

In the case of the inventive filter, a change in the frequency can be achieved without the necessity of inserting a third pole into the transfer function H(s), which third pole, instead of making the slope of the filter steeper, would destroy the steep slope of the filter at low frequencies. To this end, it is necessary to influence the parts of the circuit which determine the limit (or cut-off) frequency. Such parts are $R_1$ and $R_2$. Thus, basically, it is sufficient to change both frequency-determining resistances $R_1$ and $R_2$. Expediently, this might proceed in a synchronous manner via a double potentiometer because the desired frequency change would thus be possible in the simplest manner. This is not possible in a hearing aid, however, because double potentiometers of this type are not available in the requisite mechanical dimensions. In a further development of the invention, the change in the resistances $R_1$ and $R_2$ can proceed electronically by forming the variable resistances by means of transistors 23 and 24, FIG. 2, which are synchronously operated via a voltage stabilization represented e.g. by additional transistors 45 and 46. The shift of the limit (or cut-off) frequency can proceed continuously since the transistors 23 and 24 operate in the linear range. In the case of hearing aids, this provides optimum adaptation possibilities. In addition, the stabilization ensures that the circuit will remain functionally capable down to 1.1 volt.

In the inventive circuit, the attenuation in the stop band (or cut-off range) of the filter can also be changed. To this end, a bridging-over of the inventive filter circuit can be provided containing a potentiometer 63, FIG. 2. During adjustment of this potentiometer, a bridging-over of the entire filter circuit results. As a consequence, through the introduction of a third pole into the transfer function, the attenuation in the stop band of the filter is changed. This is important in the case of hearing aids, because slight low frequency losses on the part of the patient can be jointly compensated. In the case of other circuits, this is not so readily possible, because the high frequency characteristic is produced at several stages of the amplifier, or the amplification in the pass-band simultaneously increases. Thus, in this regard, also, the invention offers a great advantage as compared with the other circuits known from the state of the art.

With the inventive filter circuit, it is also possible to realize a multi-channel amplifier with a variable channel separation by being able to shift the slope (or filter flank) of the filter, on the one hand, and being able to influence the amplification in the attenuation range, on the other hand. For hearing aids, this has the advantage that virtually all high pitch (or treble) losses can be compensated with one apparatus due to the very effective adaptation regulating elements. This is achieved by virtue of the fact that an additional resistance, respectively, is connected in parallel with $R_1$ and $R_2$ via transistors 96 and 97, FIG. 6, so that the frequency-determining parts are switchably influenced.

In the case of the circuit-variant of FIG. 6, for example, the transition (or change-over) from one cut-off frequency to the other is switchable. Thus, with regard to the components of the circuit, what is achieved herein is that, by connecting resistances to the frequency-determining parts $R_1$ and $R_2$, the channel separation can proceed with the same steepness of slope as in the previous variant; however, it is switchable with a lower component outlay. In the same manner, it is possible to connect a random number of such resistances either simultaneously or individually, so that the shift of the filter slope (or filter flank) can proceed in a "quantized" fashion. This variant can also be laid out for a plurality of channels. In order to effect this, it is only necessary for a plurality of such stages to be connected in tandem (or in cascade), whereby it has been proven expedient to adapt the limit (or cut-off) frequency.

It will be apparent that many modifications and variations may be effected without departing from the scope of the novel concepts and teachings of the present invention.

I claim as my invention:

1. A hearing aid comprising a transistor amplifier stage including a transistor having a base, an emitter, and a collector, and a frequency-determining network, characterized in that the network is connected with the base of the transistor, and comprises first and a second capacitors in succession, a third capacitor having one terminal connected between the first and second capacitors and a second terminal connected to the collector of the transistor, first resistance means for connecting the collector to one pole of the operating-current-battery, the collector being connected to an output-point of the stage, second resistance means having one terminal connected between the first and the second capacitors, and having a second terminal connected to the emitter of the transistor, and for connection to an opposite pole of the battery, and third resistance means, connected between the collector and the base of the transistor.

2. A hearing aid according to claim 1, characterized in that the capacitance values C of all three capacitors are equal, and the second and third resistance means have resistance values R1 and R2 such that $$R_1 = \frac{a_1}{3\omega_g C a_2} \text{ and } R_2 = \frac{3}{\omega_g C a_2},$$

where $a_1$ and $a_2$ are characteristic filter coefficients and $\omega_g$ is the 3 dB-limit or cut-off frequency.

3. A hearing aid according to claim 1, characterized in that a bridging circuit is provided for connecting the input with the output of the amplifier stage which bridging circuit contains a potentiometer.

4. A hearing aid according to claim 1, characterized in that the second and third resistance means are variably constructed.

5. A hearing aid according to claim 4, characterized in that a continuous transistor control is provided for the purpose of effecting variation of the resistance means.

6. A hearing aid according to claim 4, characterized in that the transistor control has voltage stabilization means for operating the transistor control.

7. A hearing aid according to claim 4, characterized in that a preadjusted transistor control is provided which is capable of being switched on and off for effecting variation of the resistance means.

8. A hearing aid according to claim 7, characterized in that a bridging circuit is provided for connecting the input with the output of the amplifier stage which bridging circuit contains a potentiometer.

* * * * *